US 7,816,678 B2

(12) United States Patent
Noguchi et al.

(10) Patent No.: US 7,816,678 B2
(45) Date of Patent: Oct. 19, 2010

(54) ORGANIC LIGHT EMITTING DISPLAY WITH SINGLE CRYSTALLINE SILICON TFT AND METHOD OF FABRICATING THE SAME

(75) Inventors: Takashi Noguchi, Seongnam-si (KR); Wenxu Xianyu, Yongin-si (KR); Huaxiang Yin, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 139 days.

(21) Appl. No.: 12/175,778

(22) Filed: Jul. 18, 2008

(65) Prior Publication Data

US 2008/0272381 A1 Nov. 6, 2008

Related U.S. Application Data

(62) Division of application No. 11/270,541, filed on Nov. 10, 2005, now Pat. No. 7,416,924.

(30) Foreign Application Priority Data

Nov. 11, 2004 (KR) .................. 10-2004-0091851
Apr. 16, 2005 (KR) .................. 10-2005-0031689

(51) Int. Cl.
*H01L 35/24* (2006.01)
*H01L 51/00* (2006.01)
*H01L 31/00* (2006.01)
*H01L 21/00* (2006.01)
*H01L 51/40* (2006.01)

(52) U.S. Cl. .................. 257/40; 257/59; 257/E21.121; 257/E21.212; 438/149; 438/99; 438/82

(58) Field of Classification Search .................. 438/82, 438/99, 149, 455; 257/40, 59, E29.003
See application file for complete search history.

(56) References Cited

U.S. PATENT DOCUMENTS

| 2003/0094611 | A1* | 5/2003 | Hayakawa | .................... 257/49 |
| 2003/0218171 | A1* | 11/2003 | Isobe et al. | .................... 257/64 |
| 2003/0230750 | A1* | 12/2003 | Koyama et al. | ............... 257/72 |
| 2004/0229444 | A1 | 11/2004 | Couillard et al. | |
| 2005/0051777 | A1 | 3/2005 | Hill | |
| 2005/0221568 | A1 | 10/2005 | Ishida et al. | |

FOREIGN PATENT DOCUMENTS

JP    2002-156923    5/2002

* cited by examiner

*Primary Examiner*—Alexander G Ghyka
*Assistant Examiner*—Seahvosh J Nikmanesh
(74) *Attorney, Agent, or Firm*—Harness, Dickey & Pierce, P.L.C.

(57) ABSTRACT

Provided is an organic light emitting display, in which a semiconductor circuit unit of 2T-1C structure including a switching transistor and a driving transistor formed of single crystalline silicon is formed on a plastic substrate. A method of fabricating the single crystalline silicon includes: growing a single crystalline silicon layer to a predetermined thickness on a crystal growth plate; depositing a buffer layer on the single crystalline silicon layer; forming a partition layer at a predetermined depth in the single crystalline silicon layer by, e.g., implanting hydrogen ions in the single crystalline silicon layer from an upper portion of an insulating layer; attaching a substrate to the buffer layer; and releasing the partition layer of the single crystalline silicon layer by heating the partition layer from the crystal growth plate to obtain a single crystalline silicon layer of a predetermined thickness on the substrate.

3 Claims, 20 Drawing Sheets x-Si PATTERNING

SiO₂ DEPOSITION (GATE INSULATOR)

Mo or W DEPOSITION & PATTERNING (GATE)

P+ ION INJECTION

B⁺ ION INJECTION

IMD DEPOSITION & MAKING CONTACT HOLES

METAL DEPOSITION & PATTERNING

SiO2 DEPOSITION AND PATTERNNING

ANODE FORMATION

HTL DEPOSITION

ETL/EM DEPOSITION

ORGANIC LIGHT EMITTING DISPLAY WITH SINGLE CRYSTALLINE SILICON TFT AND METHOD OF FABRICATING THE SAME

CROSS-REFERENCE TO RELATED PATENT APPLICATIONS

This application is a divisional of U.S. application Ser. No. 11/270,541 filed on Nov. 10, 2005, which claims the benefit of Korean Patent Applications No. 10-2004-0091851, filed on Nov. 11, 2004 and No. 10-2005-0031689, filed on Apr. 16, 2005, in the Korean Intellectual Property Office, the disclosures of which are incorporated herein in their entirety by references.

BACKGROUND OF THE DISCLOSURE

1. Field of the Disclosure

The present disclosure relates to an organic light emission display having single crystalline silicon thin film transistor (TFT), and a method of fabricating the organic light emitting display.

2. Description of the Related Art

In active color image display devices using organic light emission diode (OLED), each of a plurality of pixels is formed of a circuit including two transistors and one capacitor. That is, the circuit for each pixel includes a switching transistor for sampling an analog image signal, a memory capacitor storing the image signal, and a driving transistor controlling electric current supplied to the OLED according to voltages of image signals accumulated in the memory capacitor. The above circuit is referred to as two transistors-one capacitor (2T-1C) structure, and an example of the circuit having the 2T-1C structure is disclosed in Japanese Patent Publication No. 2002-156923. The pixel having the 2T-1C structure can be realized on a complementary metal oxide semiconductor (CMOS) that is obtained from a wafer, that is, single crystalline silicon wafer, and it is difficult to realize the 2T-1C structure pixels in a thin film transistor (TFT).

When the OLED is formed on a glass or a plastic substrate, polycrystalline silicon TFT is used. The polycrystalline silicon has low uniformity, and thus, an additional compensation device is required in order to form the OLED using the polycrystalline silicon TFT. For example, a voltage program (Sarnoff, SID98) that directly compensates driving TFT and a current program (Sony, SID01) that determines current value of the OLED using a current mirror circuit are suggested for compensation. Various other compensation units have been suggested, however, these circuits tend to become complex due to the compensation device and it is difficult to design the circuit including the compensation device. In addition, the compensation device causes some problems.

Single crystalline silicon is useful for a system on panel (SOP) structure, in which a system is formed on a display panel. The mobility of single crystalline silicon is 300 cm$^2$/Vs or higher, and thus, a high quality switching device used in a display device can be obtained from single crystalline silicon having high mobility. However, single crystalline silicon cannot be used on a substrate that has a poor response to heat, such as a plastic.

SUMMARY OF THE DISCLOSURE

Embodiments of the present invention provide a method of fabricating an organic light emitting display having single crystalline silicon thin film transistor (TFT) by forming silicon crystalline silicon in which a substrate does not experience thermal shock.

According to an aspect of the present invention, there is provided an organic light emitting display having single crystalline silicon thin film transistor (TFT). The organic light emitting display includes X lines adapted to receive vertical scanning signals and Y lines adapted to receive horizontal driving signals disposed on a plastic substrate to cross each other in a matrix form. The display further includes organic light emitting diodes (OLEDs) disposed on pixel regions defined by the X lines and the Y lines and a semiconductor circuit unit driving the OLEDs, as well as Z lines supplying power for driving the OLEDs to the semiconductor circuit unit. The semiconductor circuit unit includes a switching transistor formed of single crystalline silicon and connected to one of the X lines and one of the Y lines; a driving transistor formed of single crystalline silicon and connected to the OLED; and a memory capacitor. The semiconductor circuit unit has a single crystalline silicon two transistors-one capacitor (2T-1C) structure on the plastic substrate.

According to another aspect of the present invention, there is provided a method of fabricating an organic light emitting display with single crystalline silicon TFT. The method includes forming a single crystalline silicon on a substrate; fabricating a semiconductor circuit unit for switching and driving OLED pixels using the single crystalline silicon; and fabricating an OLED including an organic light emitting layer on the semiconductor circuit unit. The step of forming of single crystalline silicon layer includes growing a single crystalline silicon layer to a predetermined thickness on a crystal growth plate; depositing a buffer layer on the single crystalline silicon layer; forming a partition layer at a predetermined depth in the single crystalline silicon layer by implanting hydrogen ions in the single crystalline silicon layer from an upper portion of an insulating layer; attaching a substrate to the buffer layer; and releasing the partition layer of the single crystalline silicon layer by heating the partition layer from the crystal growth plate to obtain a single crystalline silicon layer of a predetermined thickness on the substrate.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EXEMPLARY EMBODIMENTS

Hereinafter, an organic light emitting display using single crystalline silicon thin film transistor (TFT) as a switching device and a driving device of an organic light emitting diode (OLED) according to embodiments of the present invention will be described in detail with reference to the accompanying drawings.

Figure 1:
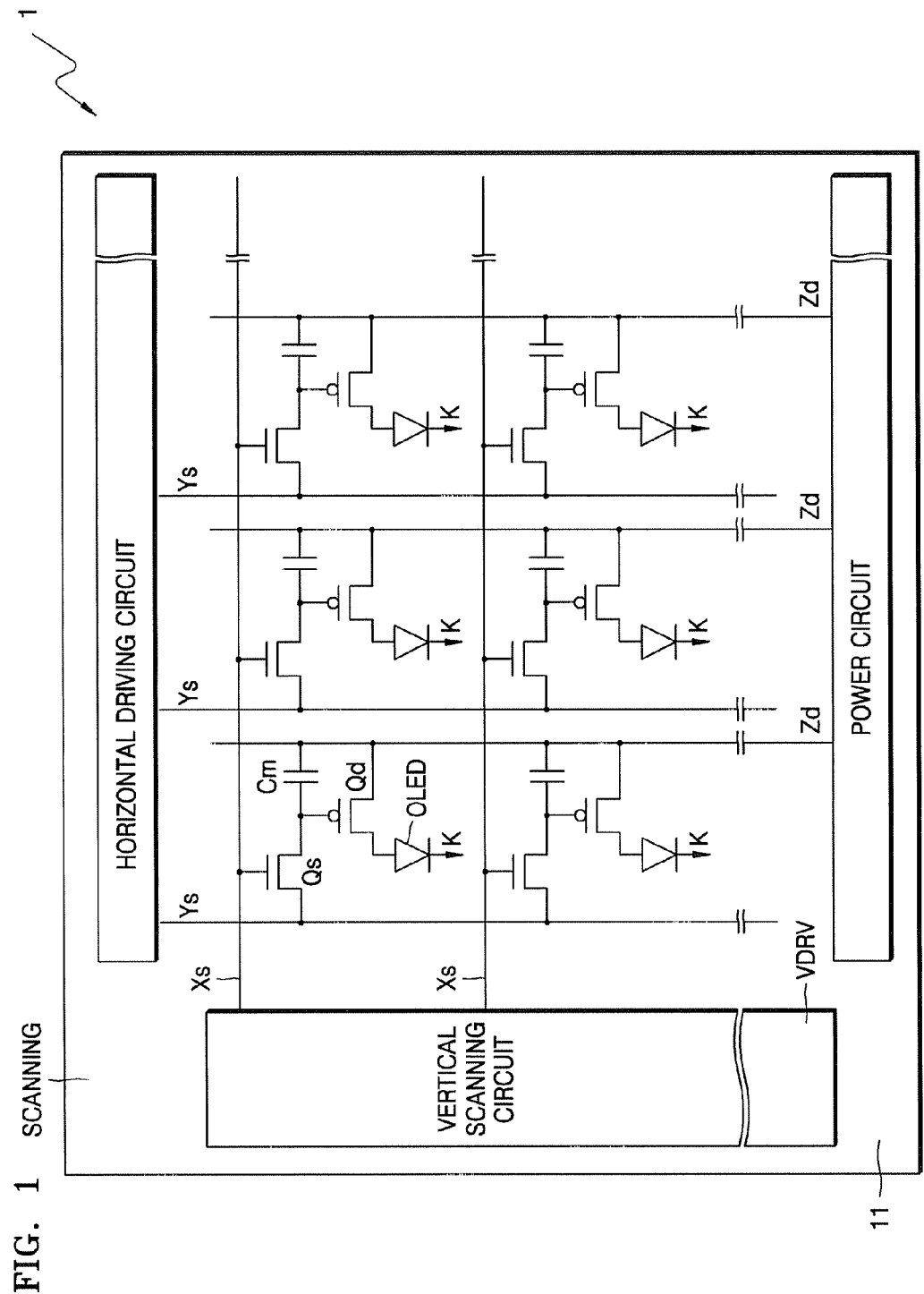
FIG. 1 is an equivalent circuit diagram of an organic light emitting display using single crystalline silicon formed on a plastic substrate according to an embodiment of the present invention.
Figure 2:
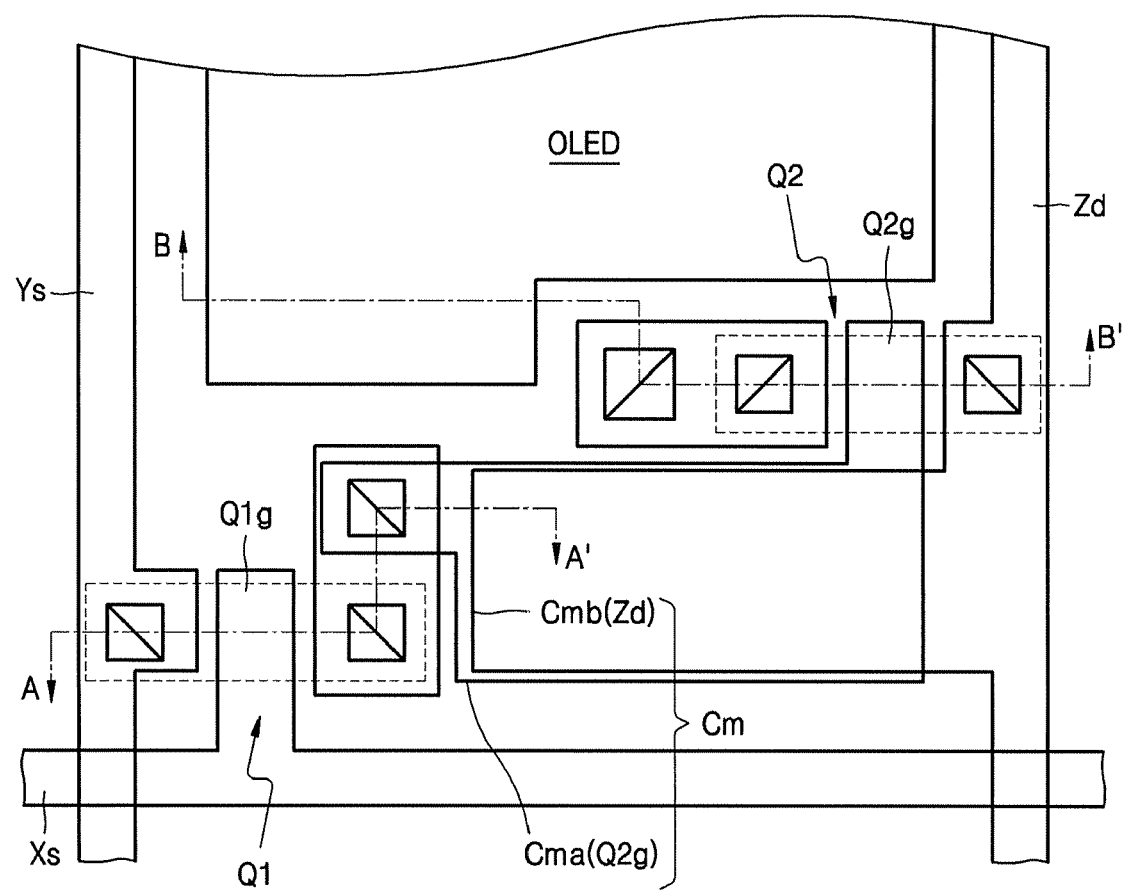
FIG. 2 illustrates the layout of a pixel in the organic light emitting display of FIG. 1 according to an embodiment of the present invention.

FIG. 1 is an equivalent circuit diagram illustrating a schematic structure of the organic light emitting display according to embodiments of the present invention, and FIG. 2 illustrates a layout of each pixel.

A display device 1 uses a plastic substrate 11 as a base panel. Referring to FIG. 1, the display device 1 of an embodiment of the present invention has a system on panel (SOP) structure, since single crystalline silicon can be formed on a plastic substrate or a glass substrate according to the fabrication method of an embodiment of the present invention.

On the substrate 11, a plurality of parallel X lines Xs and a plurality of parallel Y lines Ys are disposed to cross each other to form a matrix. Z lines Zd are disposed parallel to the Y lines Ys with predetermined distances therebetween. Pixels are defined on regions surrounded by the X lines Xs, the Y lines Ys, and the Z lines Zd.

Vertical scanning signals are applied to the X lines Xs, and horizontal driving signals, that is, image signals, are applied to the Y lines Ys. The X lines Xs are connected to a vertical scanning circuit, and the Y lines Ys are connected to a horizontal driving circuit. The Z lines Zd are connected to a power circuit driving the OLED.

Each of the pixels includes two transistors (Q1 and Q2) and one capacitor (Cm). A source and a gate of a switching transistor Q1 in each pixel are connected to the X line Xs and the Y line Yx, and a drain of the switching transistor Q1 is connected to a gate of a driving transistor Q2. A memory capacitor Cm accumulates electric charges applied by the operation of the switching transistor Q1 to store image information of the each pixel, and is connected to a gate and a source of the driving transistor Q2 in parallel. An anode of the OLED is connected to a drain of the driving transistor Q2. A cathode K of the OLED corresponds to a common electrode shared by a number or all of the pixels. Here, the switching transistor Q1 is an n-type TFT, and the driving transistor Q2 is a p-type TFT. Single crystalline silicon of the above transistors Q1, Q2 has crystallized direction of [100] or [111].

Referring to FIG. 2, the Y line Ys and the Z line Zd are disposed parallel to each other, and the X line Xs is disposed to cross the Y and Z lines Ys and Zd. The switching transistor Q1 is located at a portion where the X line Xs and the Y line Yd cross each other, and the driving transistor Q2 is located around a portion where the X line Xs and the Z line Zd cross each other. The memory capacitor Cm is disposed between the switching transistor Q1 and the driving transistor Q2. An upper electrode Cmb of the memory capacitor Cm extends from the Z line Zd, and a lower electrode Cma of the memory capacitor Cm is integrally formed with the drain Q1d of the switching transistor Q1 and the gate Q2g of the driving transistor Q2. The gate Q1g of the switching transistor Q1 is a portion extending from the X line Xs.

Figure 3:
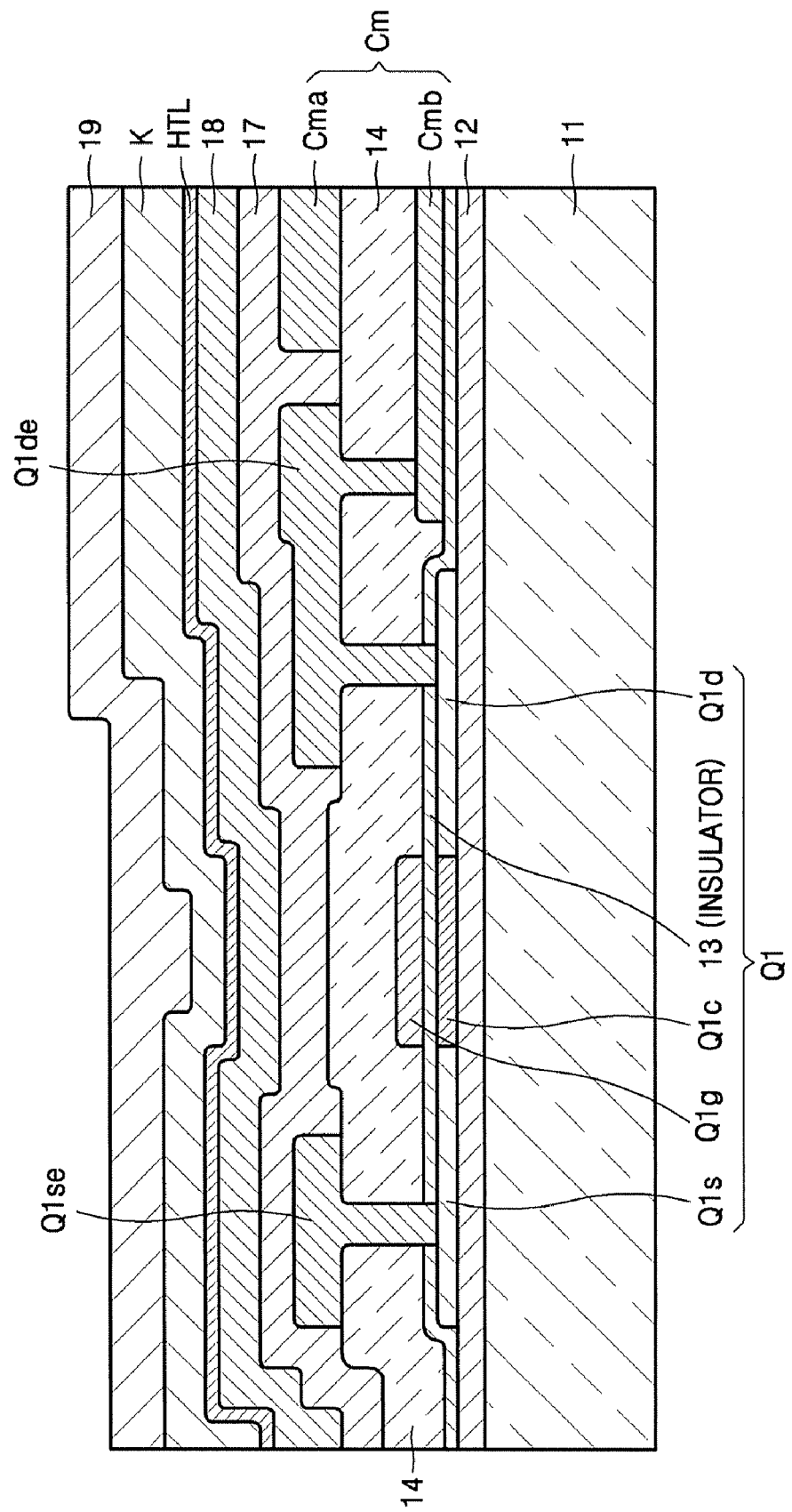
FIG. 3 is a cross-sectional view of the organic light emitting display taken along line A-A' of FIG. 2 according to an embodiment of the present invention.

Referring to FIG. 3 illustrating the pixel taken along line A-A' of FIG. 2, a buffer layer 12 formed of an insulating material such as SiON is formed on the substrate 11, and the switching transistor Q1 is formed on the buffer layer 12. The switching transistor Q1 includes a single crystalline silicon layer having the source Q1s, a channel Q1c, and the drain Q1d formed on the buffer layer 12, a first insulating layer 13 formed of $SiO_2$, and the gate Q1g. An intermetal dielectric (IMD) 14 formed of $SiO_2$ is formed on the switching transistor Q1, and a source electrode Q1se and a drain electrode Q1de formed of metal are formed on the IMD 14. Lower portions of the above electrodes Q1se and Q1de are electrically connected to the source Q1s and the drain Q1d through penetration holes formed on the IMD 14. The above electrodes Q1se and Q1de, the upper electrode Cmb of the memory capacitor Cm, and the Z line Zd can have structures, in which Mo/Al/Mo or Ti/Al—Cu alloy/Ti are stacked. The gate Q1g of the switching transistor Q1 extends from the X line Xs, and is formed of tungsten.

A dielectric layer of the memory capacitor Cm is a part of the IMD 14, and the lower electrode Cma is formed of tungsten and is integrally formed with the gate of the driving transistor Q2 as described above.

A second insulating layer 17 and a third insulating layer 18 are formed on the upper electrode Cmb integrally formed with the Z line Zd and on the source and drain electrodes Q1se and Q1de. In addition, a hole transport layer (HTL), a common electrode (K), that is, the cathode of the OLED, and a fourth insulating layer 19 are disposed on the second and third insulating layers 17 and 18. The fourth insulating layer 19 is a passivation layer for protecting the OLED.

Figure 4:
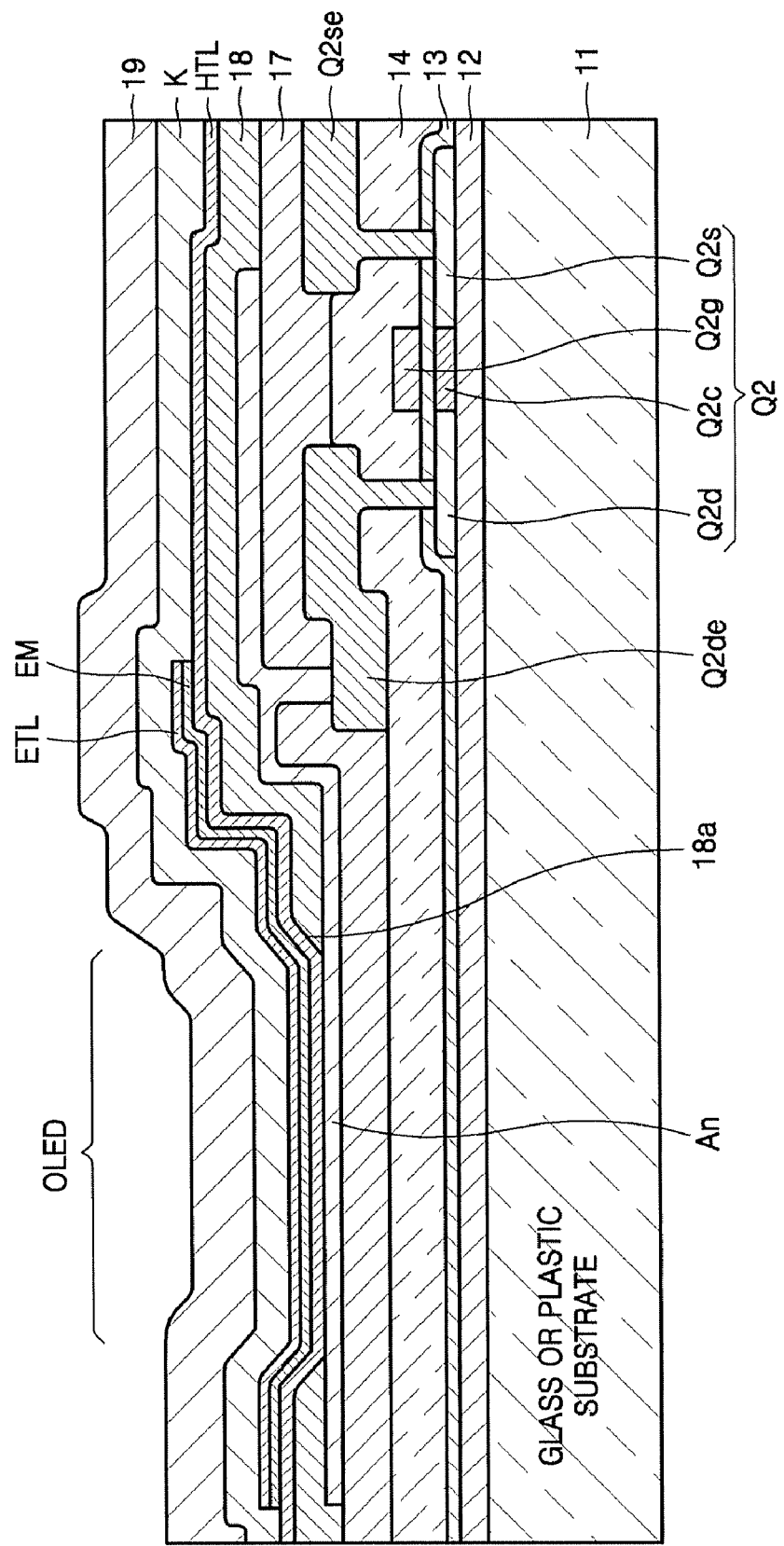
FIG. 4 is a cross-sectional view of the organic light emitting display taken along line B-B' of FIG. 2 according to an embodiment of the present invention.

FIG. 4 is a cross-sectional view of the display taken along line B-B' of FIG. 2, and illustrates entire stacked structure of the driving transistor Q2 and the OLED.

The buffer layer 12 is formed on the plastic or glass substrate 11, and the driving transistor Q2 that is formed simultaneously with the switching transistor Q1 is formed on the buffer layer 12. Single crystalline silicon layer of the driving transistor Q2 is obtained from the same material as that of the silicon layer used to fabricate the switching transistor Q1. The single crystalline silicon layer includes a source Q2s, a channel Q2c, and a drain Q2d, and the first insulating layer 13 formed of $SiO_2$ and the gate Q2g are formed. The gate Q2g is integrally formed with the upper electrode Cmb of the memory capacitor Cm using tungsten, as described above.

The IMD 14 formed of $SiO_2$ covering the switching transistor Q1 is formed on the driving transistor Q2, and the source electrode Q2se and the drain electrode Q2de formed of metal are formed on the IMD 14. The lower portions of the source and drain electrodes Q2se and Q2de are electrically connected to the source Q2s and the drain Q2d through penetration holes formed on the IMD 14, and the second and third insulating layers 17 and 18 are formed on the source and drain electrodes Q2se and Q2de.

The HTL is disposed on the third insulating layer 18, and a light emitting layer (EM) and an electron transport layer (ETL) are formed on a predetermined region of the HTL. Then, the common electrode K, that is, the cathode, is formed on the stacked structure of the HTL, EM, and ETL. The fourth insulating layer 19 is formed on the common electrode K. Meanwhile, an anode An that is connected to the drain electrode Q2de and located under the OLED is disposed between the second and third insulating layers 17 and 18. The anode An physically contacts the HTL through a window 18a formed on the third insulating layer 18 to be electrically connected to the HTL.

The above described layout of the organic light emitting display is an example of the present invention, and the above layout and modifications thereof do not limit the scope of the present invention.

According to the organic light emitting display of embodiments of the present invention, a semiconductor circuit unit having two transistors-one capacitor (2T-1C) structure for driving the OLED is formed using single crystalline silicon on the substrate weak against heat such as a plastic substrate, without forming a conventional compensation circuit.

A method of fabricating the organic light emitting display according to embodiments of the present invention will be described as follows.

Figure 5A:
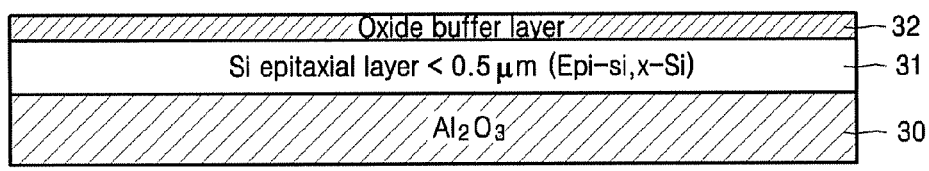
FIGS. 5A through 5G are views illustrating processes of fabricating single crystalline silicon film according to an embodiment of the present invention.

Referring to FIG. 5A, a Si epitaxial layer, that is, a single crystalline silicon film 31 and an oxide layer, for example, an oxide buffer layer 32 (formerly 12) are sequentially formed on a crystal growth plate, that is, an $Al_2O_3$ substrate 30 for crystal growth, using a crystal growth method. It is desirable that a thickness of the single crystalline Si film 31 is 0.5 μm or less.

Figure 5B:
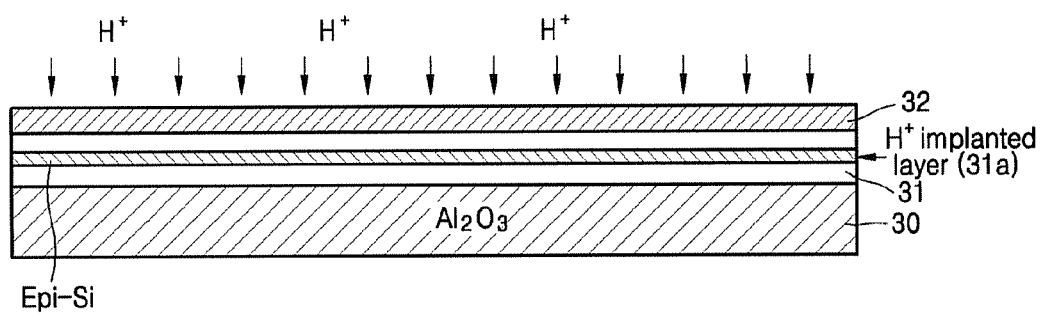

Referring to FIG. 5B, hydrogen ions (H+) are injected to form an implanted layer at an intermediate portion of the single-crystal Si film 31 as a partition layer 31a.

Figure 5C:
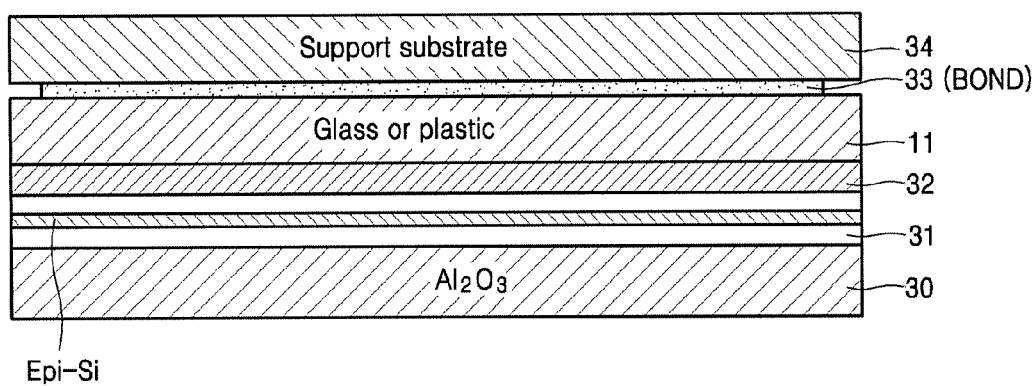

Referring to FIG. 5C, a glass or plastic substrate 10 attached to a supporter 34 by a bond layer 33 is bonded to the Si film 31. To do this, the oxide buffer layer 32 and the Si film 31 under the oxide buffer layer 32 are activated by oxygen plasma, and the substrate 11 is attached to the Si film 31 in an air atmosphere at room temperature.

Figure 5D:
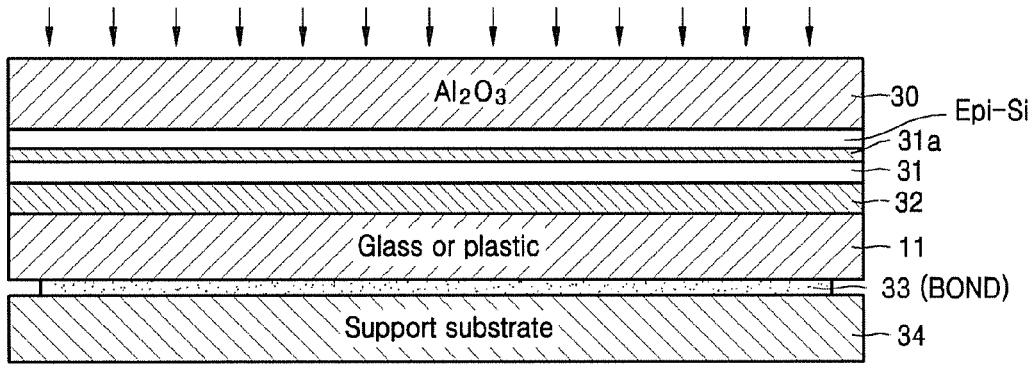
Figure 5E:
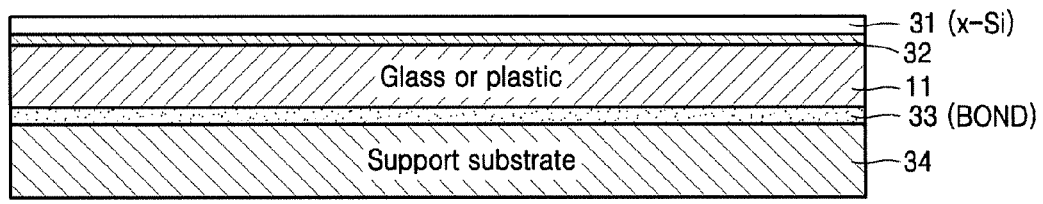
Figure 5F:
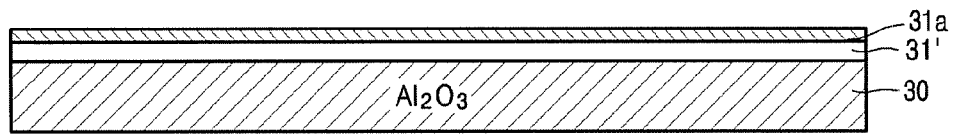

Referring to FIG. 5D, thermal energy, for example, excimer laser of 308 nm, is applied evenly onto the crystal growth plate 30. The implanted layer, that is, the partition layer 31a, which experiences strain due to the impurities, is separated by the thermal energy, and then, the Si film 31 is separated into a Si film 31' at the $Al_2O_3$ substrate 30 side illustrated in FIG. 5F and a Si film 31 at the glass or plastic substrate 10 side illustrated in FIG. 5E.

Figure 5G:
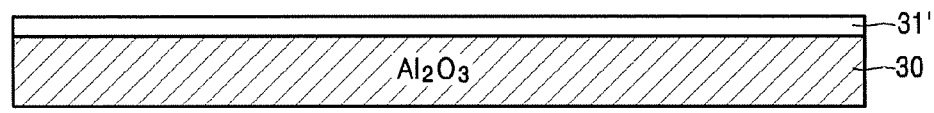

The supporter 34 is separated from the bottom surface of the substrate 11, and after that, the organic light emitting display having the single crystalline silicon TFT shown in FIGS. 1 through 4 using the substrate 11 in TFT fabrication processes and OLED fabrication processes. In addition, the $Al_2O_3$ substrate 30 is used again in the processes for growing new single crystalline silicon film. The remaining single crystalline silicon film on the $Al_2O_3$ substrate 30 is polished before the $Al_2O_3$ substrate 30 is re-used (refer to FIG. 5G).

It is preferable that the single crystalline silicon on the substrate 10 is polished to have a predetermined thickness and an even surface by a polishing device before performing the TFT fabrication processes.

Figure 6A:
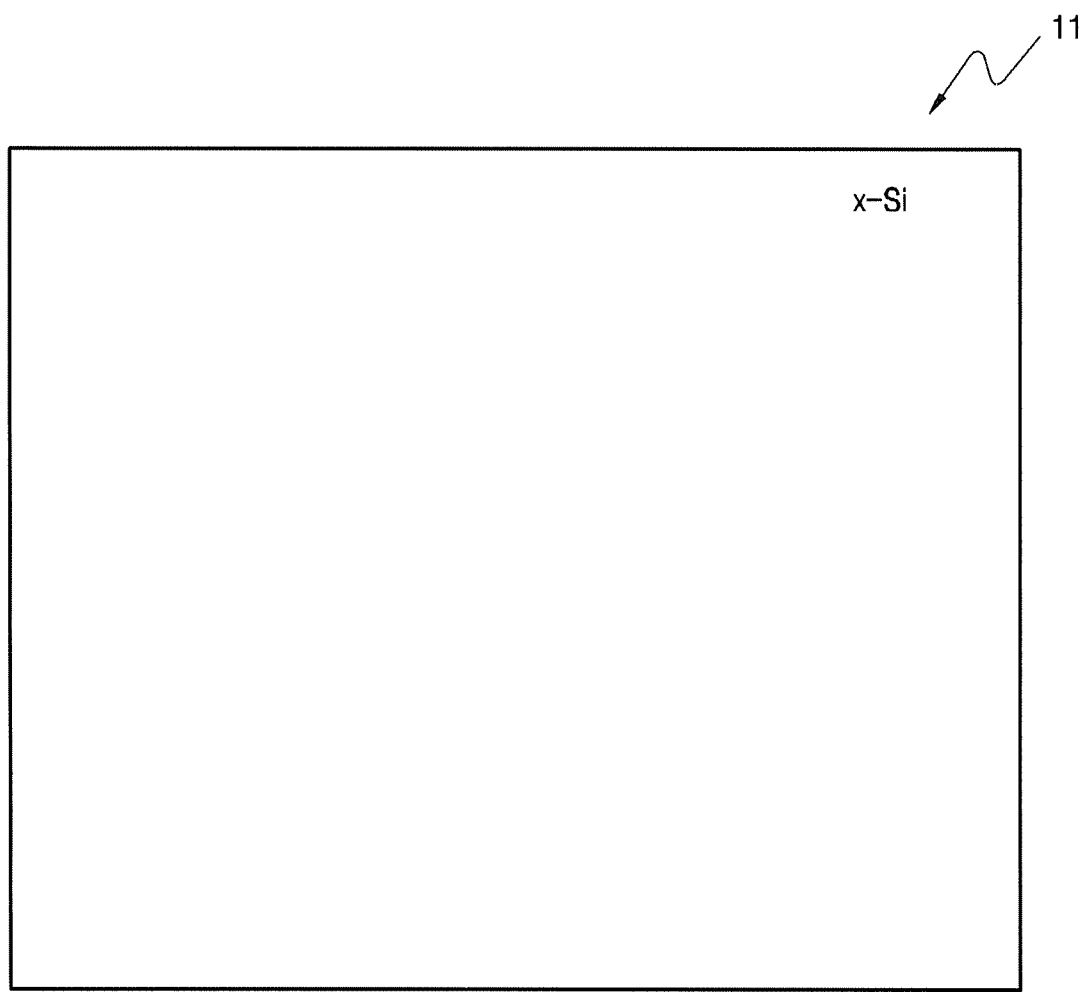
FIGS. 6A through 6N are views illustrating processes of fabricating a semiconductor circuit unit using the single crystalline silicon.
Figure 6B:
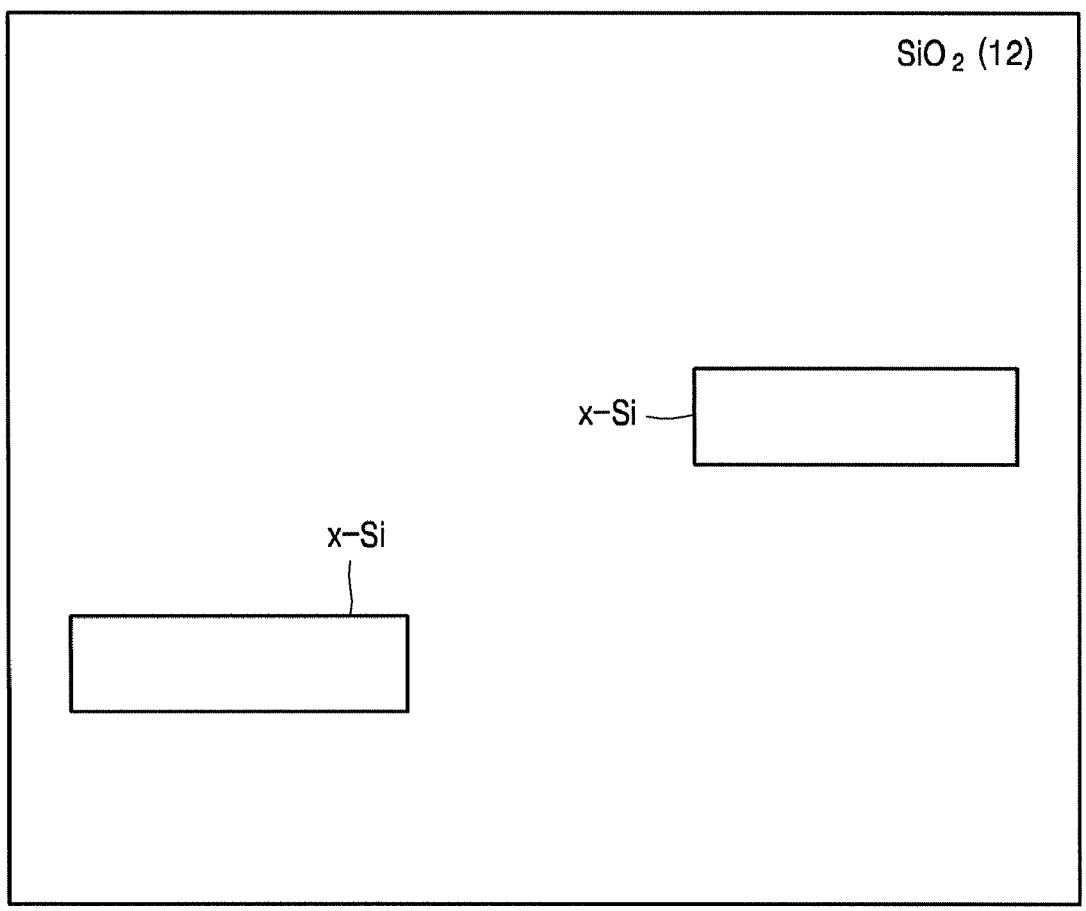
Figure 6C:
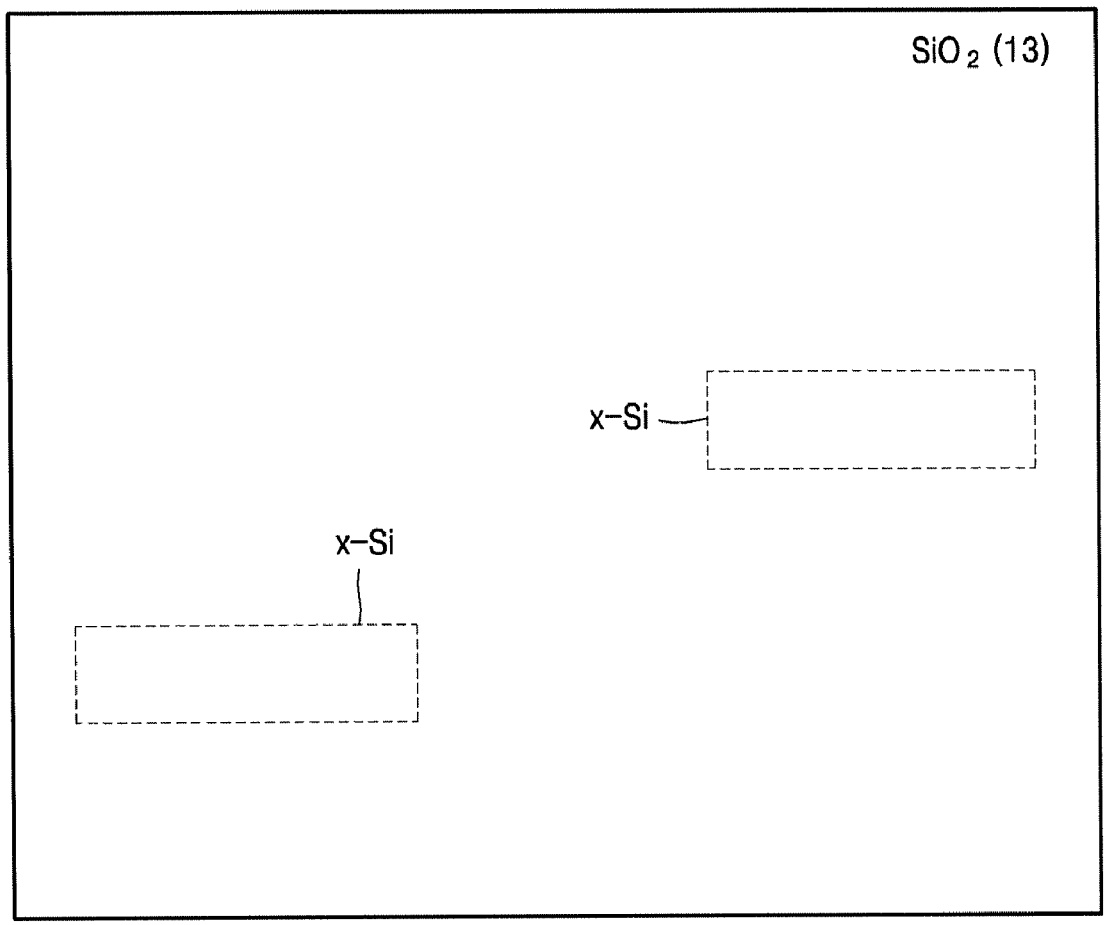
Figure 6D:
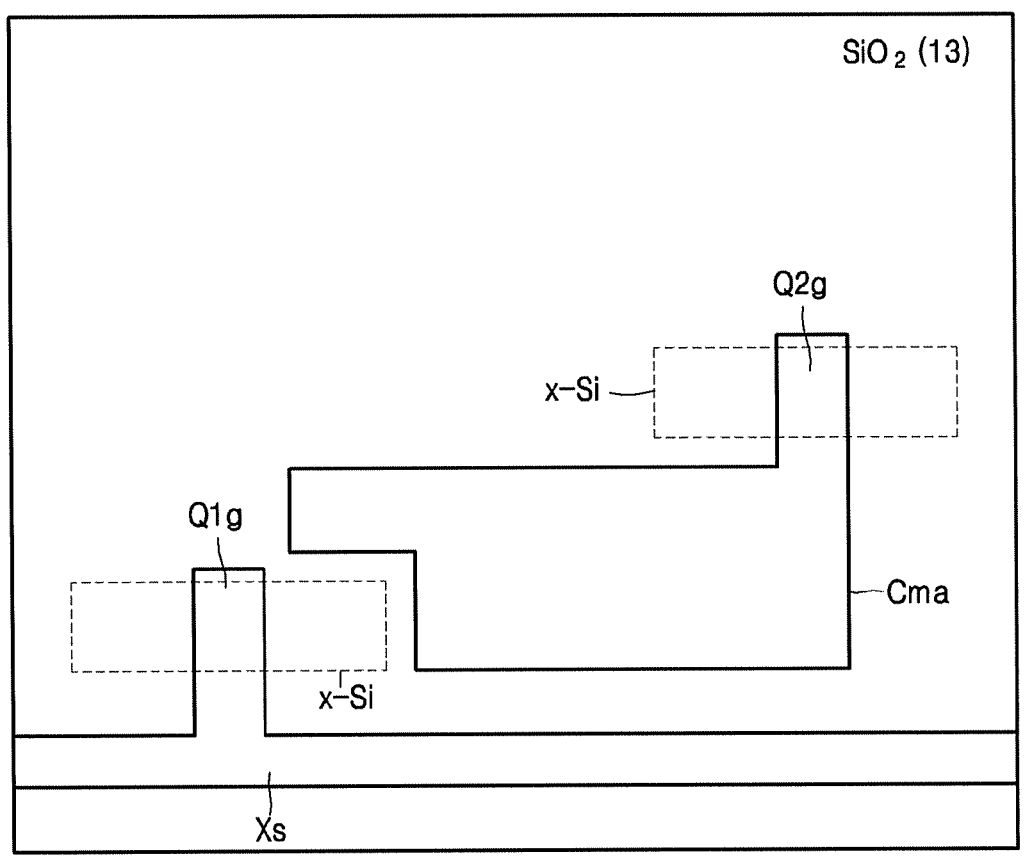
Figure 6E:
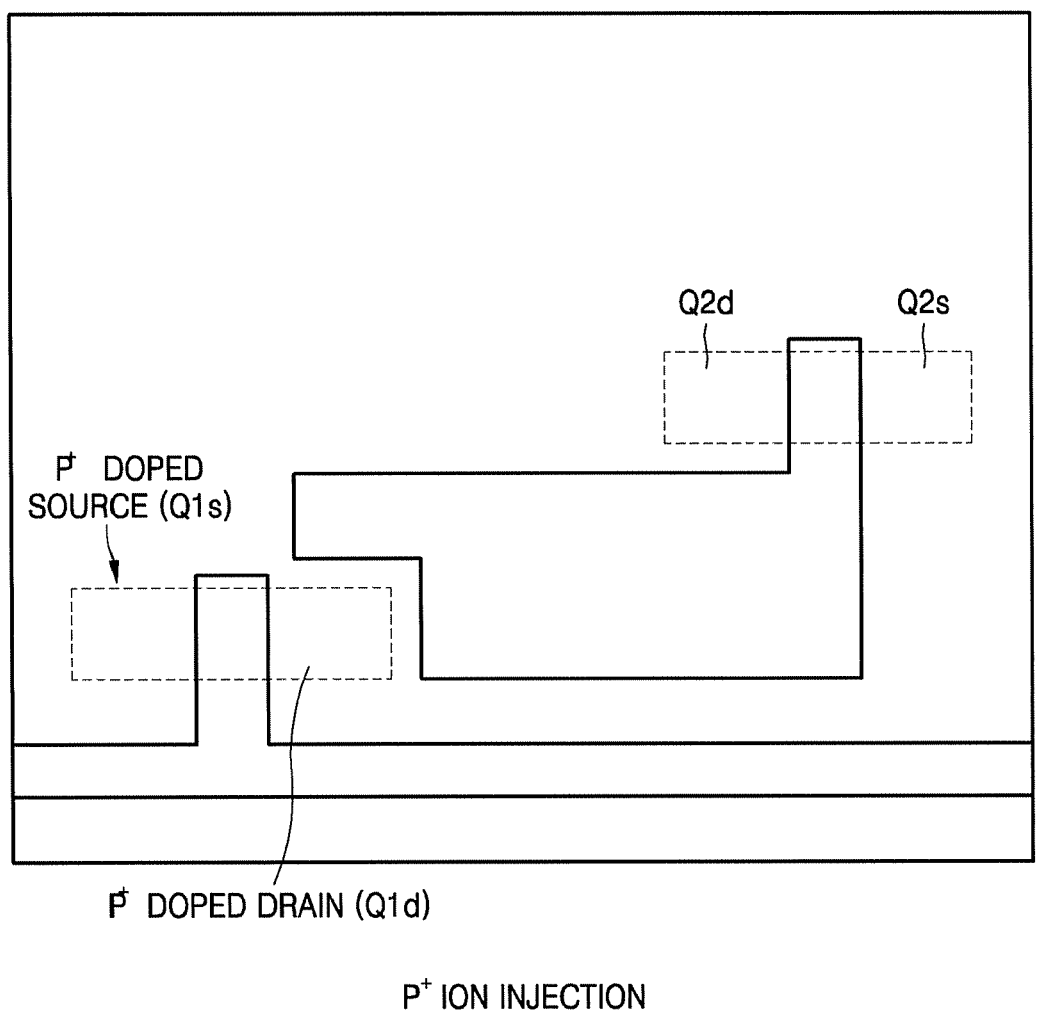
Figure 6F:
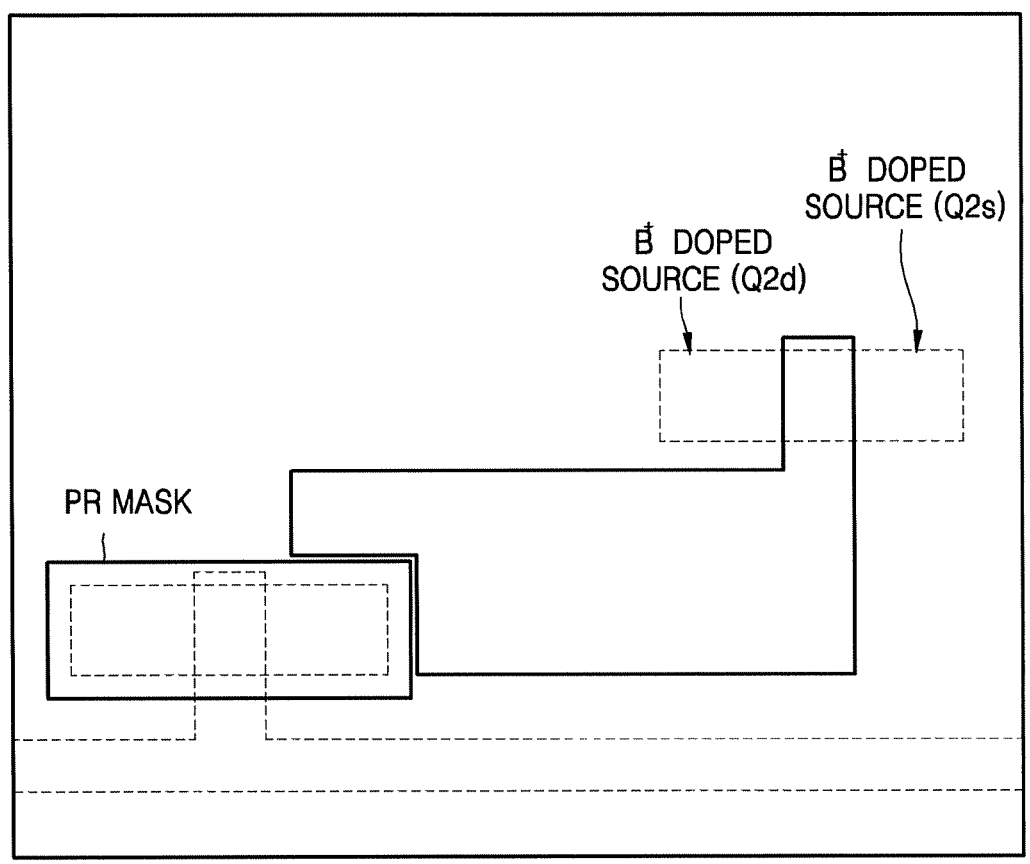
Figure 6G:
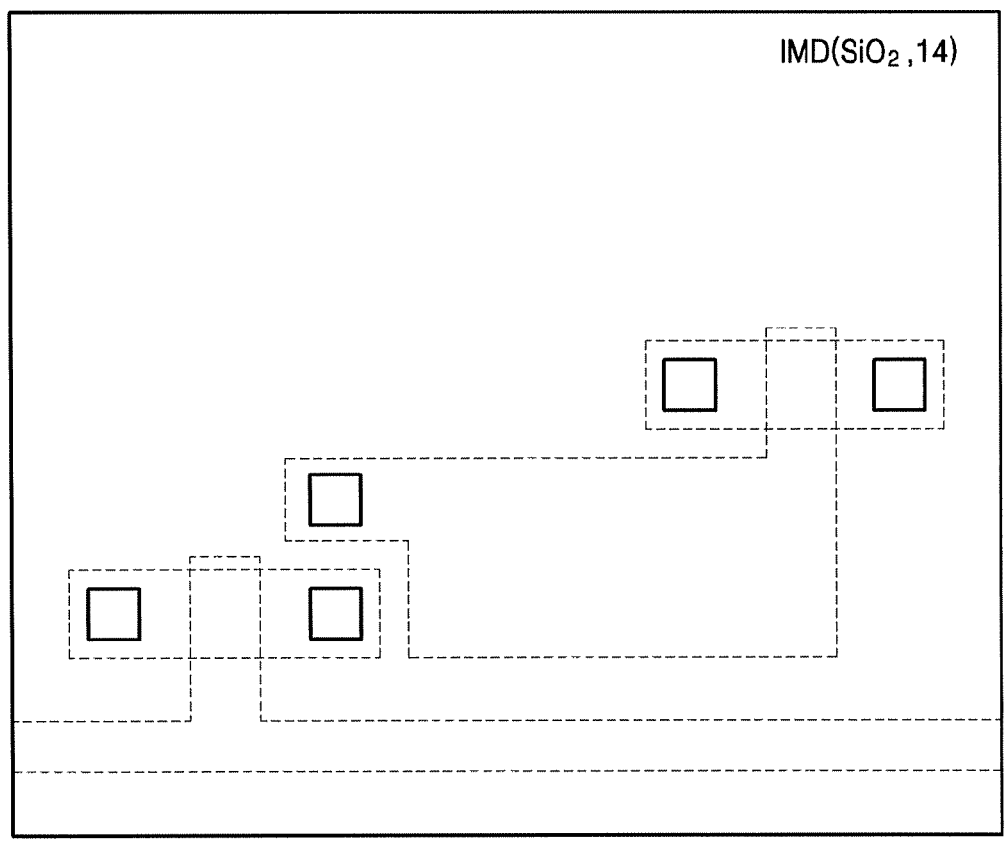
Figure 6H:
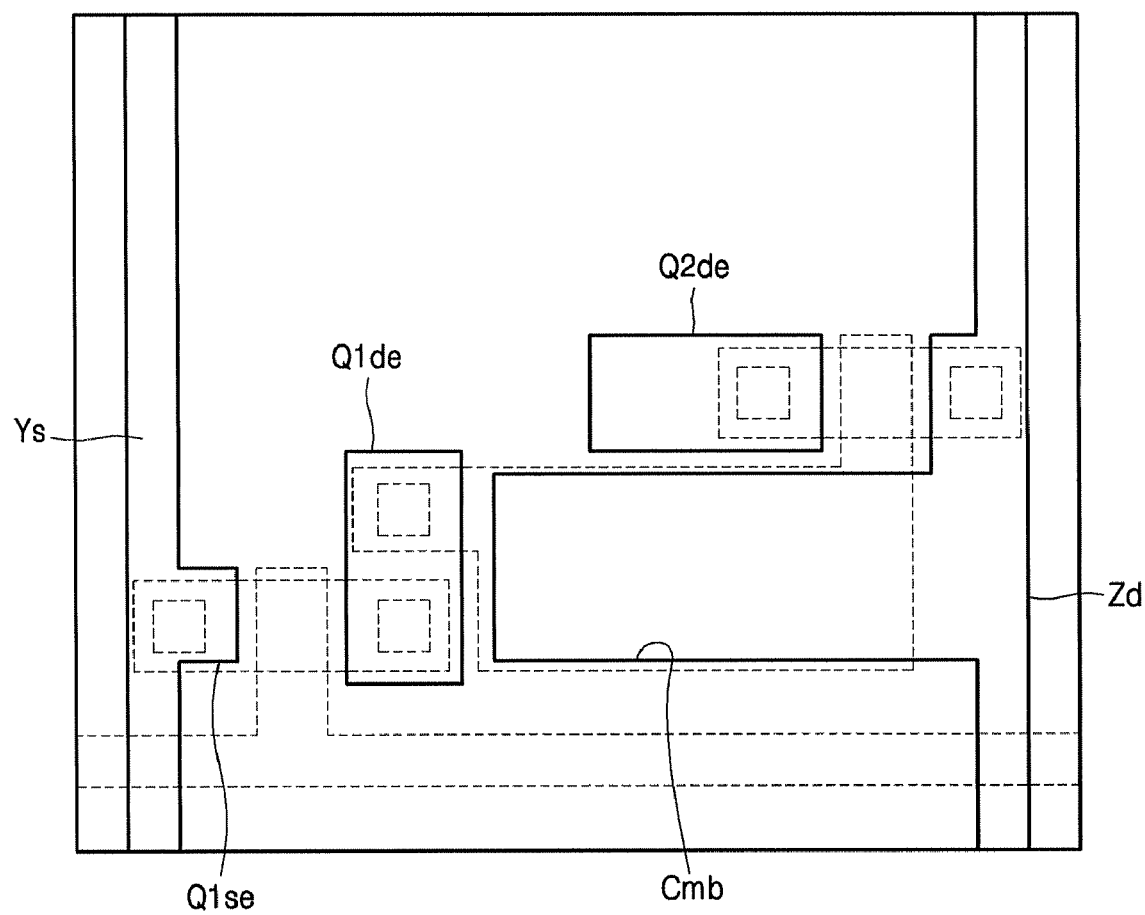
Figure 6I:
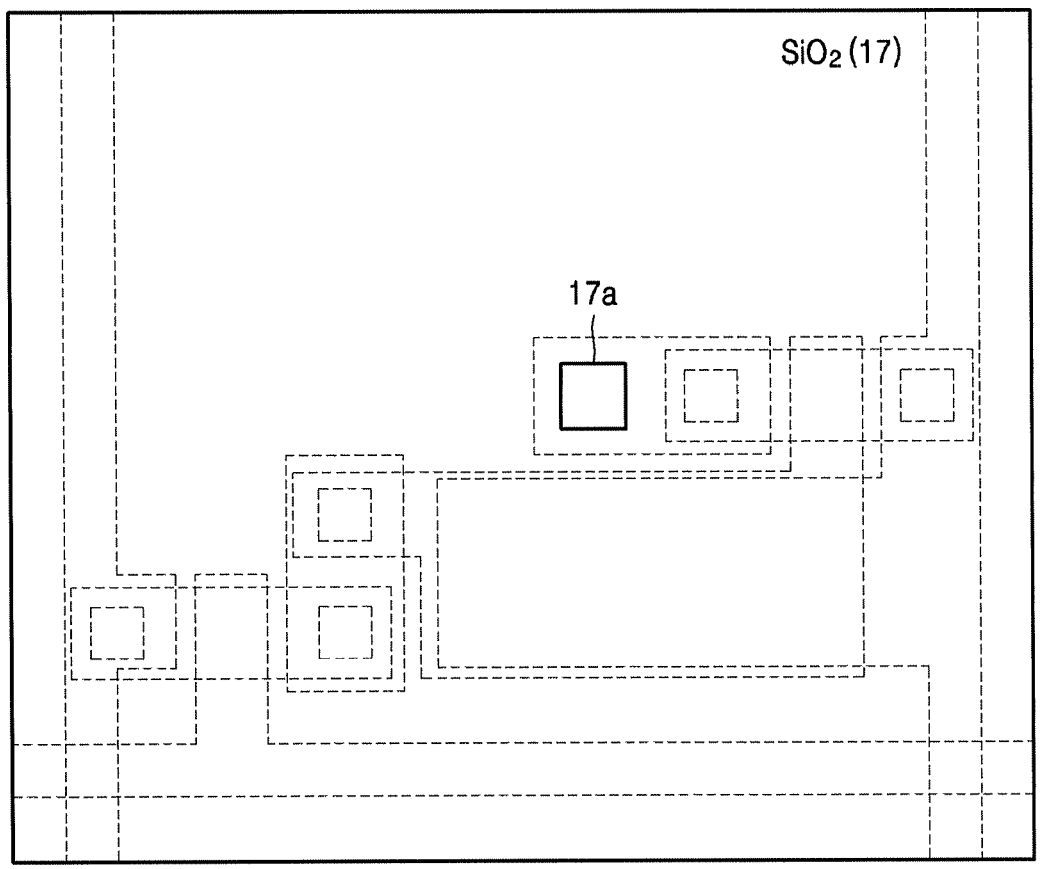
Figure 6J:
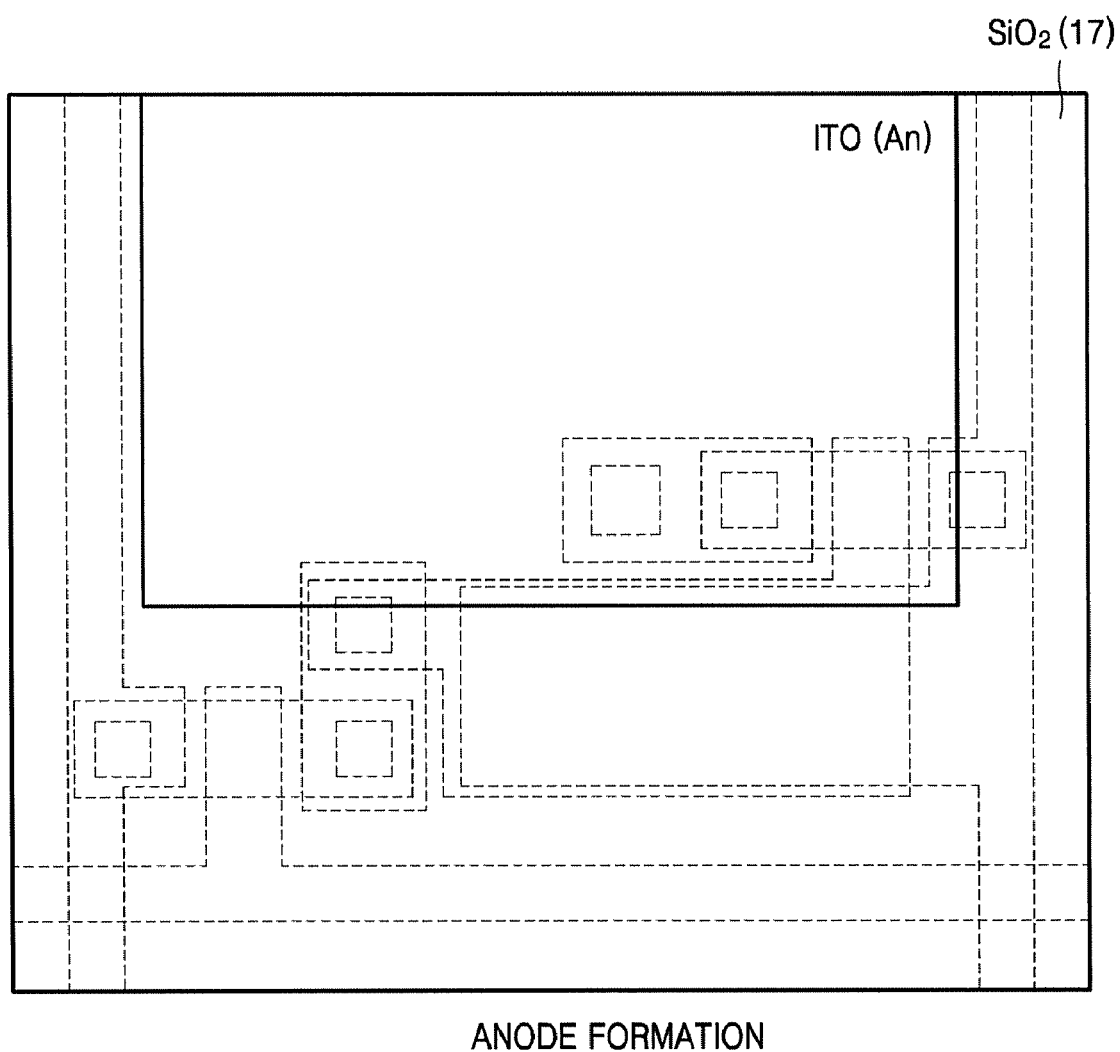
Figure 6K:
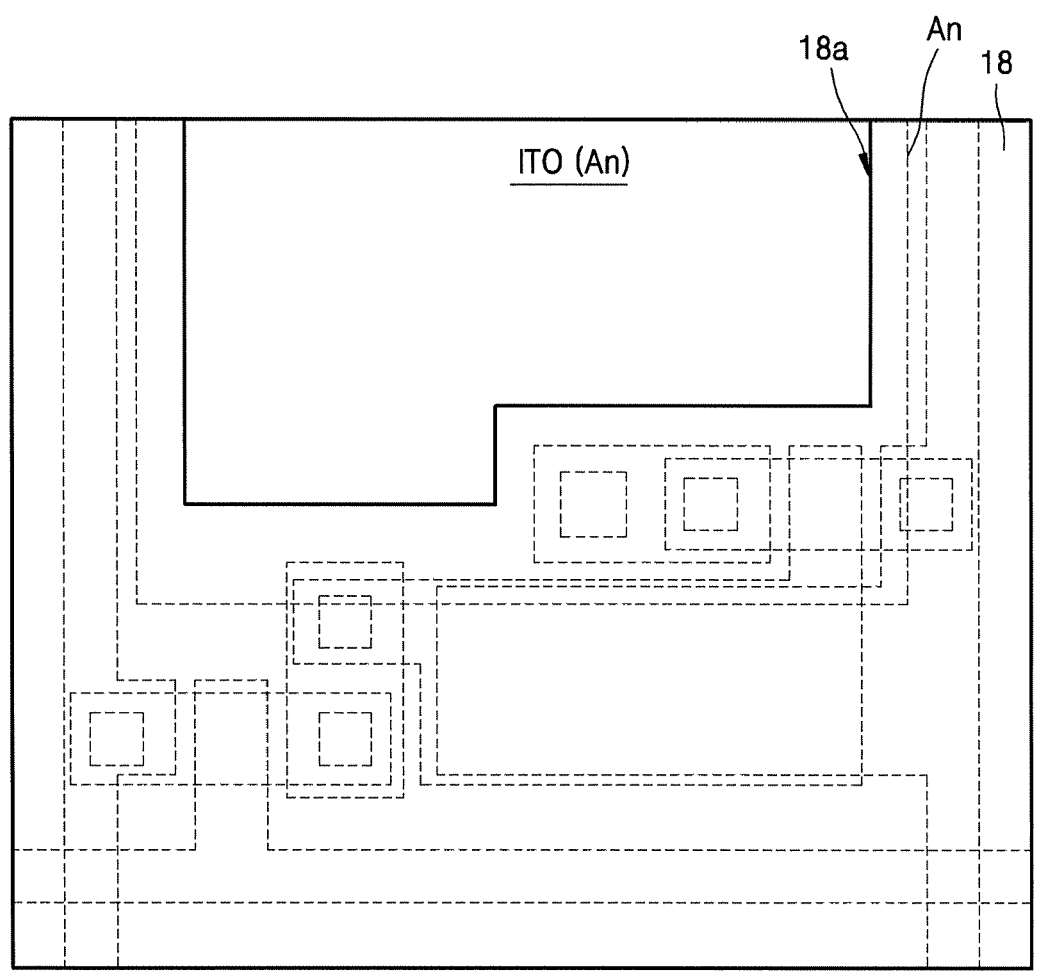
Figure 6L:
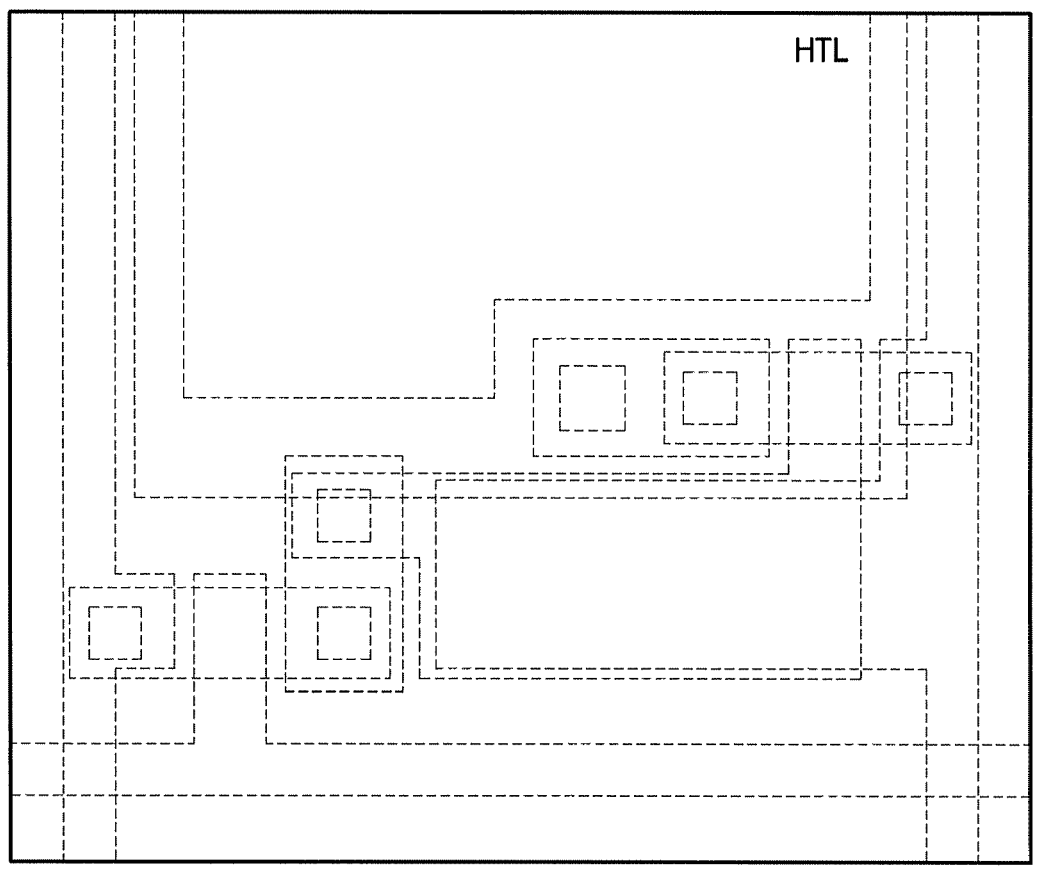
Figure 6M:
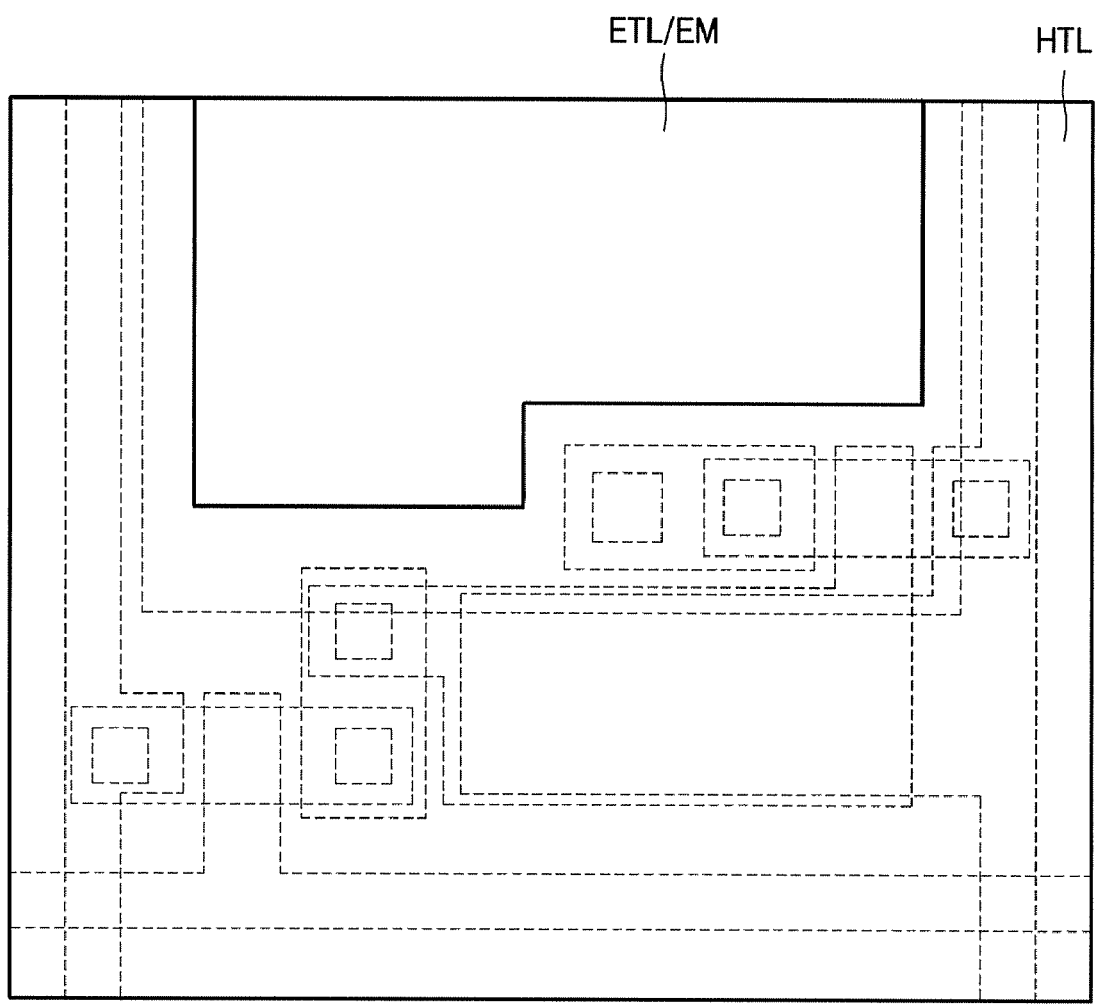
Figure 6N:
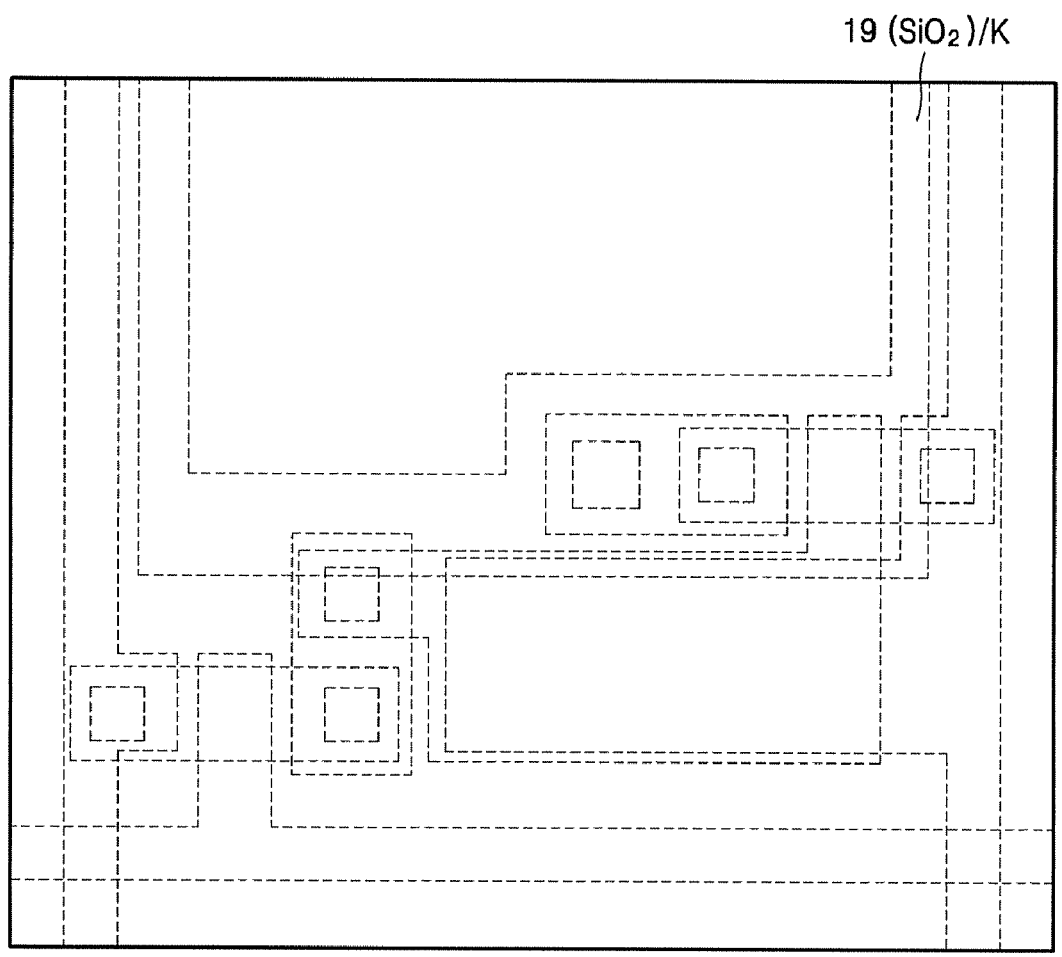

FIGS. 6A through 6N illustrate processes for fabricating the semiconductor circuit unit using the single crystalline silicon.

Referring to FIG. 6A, single crystalline silicon (x-Si) is formed on a glass or plastic substrate 11 through the above described processes. FIG. 6A illustrates a portion corresponding to a unit pixel of the organic light emitting display.

Referring to FIG. 6B, the single crystalline silicon is patterned to form islands of single crystalline silicon x-Si that will be used to form the switching transistor Q1 and the driving transistor Q2. The single crystalline silicon x-Si is patterned using well-known conventional patterning method, for example, the photolithography method.

Referring to FIG. 6C, a gate insulating layer 13 formed of $SiO_2$ is deposited using a chemical vapor deposition (CVD) method.

Referring to FIG. 6D, a Mo metal layer or W metal layer is formed on the gate insulating layer 13 using a deposition or a sputtering method, and is patterned in a wet-etching method using a photoresist to form the X line Xs, the gates Q1g and Q2g, and the lower electrode Cma of the memory capacitor Cm.

Referring to FIG. 6E, phosphorus (P+) ions are injected into the single crystalline silicon x-Si that is not covered by the gates Q1g and Q2g using an ion injection process to obtain the source Q1s and the drain Q1d of the switching transistor Q1. If a mask protecting the single crystalline silicon of the driving transistor Q2 is additionally deposited on the gate insulating layer 13, the single crystalline silicon of the driving transistor Q2 is not doped.

Referring to FIG. 6F, after forming a photoresist mask protecting the switching transistor Q1, boron (B+) ions are injected onto the silicon to obtain p-type source Q2s and drain Q2d of the driving transistor Q2. If the driving transistor Q1 is N-doped through the previous processes, it is converted into P-doped transistor through the sufficient doping of B+ ions. After doping P+ ions and B+ ions, single crystalline silicon of the switching transistor Q1 and single crystalline silicon of the driving transistor Q2 are activated through an annealing process.

Referring to FIG. 6G, $SiO_2$ is deposited on the above stacked layers using the CVD process to form the IMD 14, and contact holes are formed on the IMD 14 for contacting the switching transistor Q1 and the driving transistor Q2.

Referring to FIG. 6H, a metal layer is deposited on the IMD 14 and patterned to form the Y line Ys, the Z line Zd, the source and drain electrodes Q1se and Q1de of the switching transistor Q1, the source and drain electrodes Q2se and Q2de of the driving transistor Q2, and the electrode Cmb of the memory capacitor Cm.

Referring to FIG. 6I, the second insulating layer 17 formed of $SiO_2$ is deposited on the above stacked layers, and a contact hole 17a exposing the drain electrode Q2de of the driving transistor Q2 is formed on the second insulating layer 17.

Referring to FIG. 6J, a conductive material such as indium tin oxide (ITO) is formed on the second insulating layer 17, and is patterned to form the anode An of the OLED.

Referring to FIG. 6K, the third insulating layer 18 is formed on the above stacked layer, and the window 18a exposing the ITO anode An is formed on the OLED region.

Referring to FIG. 6L, the HTL is deposited on the entire upper surfaces of the third insulating layer 18 and the ITO anode An.

Referring to FIG. 6M, the EM and ETL are sequentially deposited on the HTL.

Referring to FIG. 6N, the common electrode K, that is, the cathode of the OLED and the fourth insulating layer 19 formed of $SiO_2$ are sequentially deposited on the uppermost stacked layer including the ETL to obtain the organic light emitting display.

Processes of fabricating the transistor and capacitor driving the pixel are described above, however, according to embodiments of the present invention, the single crystalline silicon is formed on the plastic or glass substrate, an LSI for driving the light emitting display can be performed simultaneously on the same substrate, and thus, the system on panel (SOP) can be realized.

The above described method of fabricating the transistor and capacitor is an example of a method of fabricating an organic light emitting display including a single crystalline silicon TFT fabricated according to embodiments of the present invention. However, this method can be modified in various ways.

According to embodiments of the present invention, the organic light emitting display having the semiconductor circuit unit of single crystalline silicon 2T-1C type for driving the OLED on the plastic or glass substrate can be obtained. Instead of the plastic or glass substrate that is susceptible to heat damage in the heat treatment process, the crystal growth plate is used to obtain a high quality single crystalline silicon film. In addition, the partition layer can be formed in the single crystalline silicon film formed on the crystal growth plate in the ion implantation process, and thus, a desired very thin silicon film, the thickness of which is 100 nm or thinner, can be obtained.

Therefore, according to embodiments of the present invention, since the silicon layer is formed on the plastic substrate or the glass substrate, a system on glass (SOG) or a system on panel (SOP) structure using the single crystalline silicon can be formed. Thus, according to embodiments of the present invention, a high performance TFT having high reproducibility and less performance variation between the elements can be fabricated. In addition, the single crystalline silicon is grown using the $Al_2O_3$ substrate having a high thermal endurance, and then, moved onto the plastic or glass substrate, and thus, the $Al_2O_3$ substrate can be repeatedly used to grow new single crystalline silicon. Therefore, according to embodiments of the present invention, a high quality organic light emitting display can be fabricated.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting display having a single crystalline silicon thin film transistor (TFT), the organic light emitting display, comprising:
    a plurality of X lines adapted to receive vertical scanning signals and a plurality of Y lines adapted to receive horizontal driving signals disposed on a substrate to cross each other in a matrix form;
    a plurality of organic light emitting diodes (OLEDs) disposed on pixel regions defined by the X lines and the Y lines;
    a semiconductor circuit unit driving the OLEDs; and
    a plurality of Z lines supplying power adapted to drive the OLEDs to the semiconductor circuit unit,
    wherein the substrate is a plastic substrate, and the semiconductor circuit unit includes:
        a switching transistor formed of single crystalline silicon and connected to one of the X lines and one of the Y lines;
        a driving transistor formed of single crystalline silicon and connected to the OLEDs; and
        a memory capacitor,
    wherein the semiconductor circuit unit has a single crystalline silicon two transistors-one capacitor (2T-1C) structure on the plastic substrate, and
    at least one channel of the switching transistor and at least one channel of the driving transistor is formed of the single crystalline silicon.

2. The display of claim 1, further comprising an insulating layer on the plastic substrate, wherein the semiconductor circuit unit having the 2T-1C structure is on the insulating layer.

3. The display of claim 1, wherein the single crystalline silicon of the switching transistor and the driving transistor has a crystallized direction of [100] or [111].

* * * * *